(12) United States Patent
Klein

(10) Patent No.: US 7,264,988 B2
(45) Date of Patent: Sep. 4, 2007

(54) ELECTRO-AND ELECTROLESS PLATING OF METAL IN THE MANUFACTURE OF PCRAM DEVICES

(75) Inventor: Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/265,750

(22) Filed: Nov. 2, 2005

(65) Prior Publication Data

US 2006/0068543 A1 Mar. 30, 2006

Related U.S. Application Data

(62) Division of application No. 09/956,783, filed on Sep. 20, 2001, now Pat. No. 7,109,056.

(51) Int. Cl.
H01L 21/00 (2006.01)
(52) U.S. Cl. .......................................... 438/95; 438/678
(58) Field of Classification Search .................. 438/95, 438/678
See application file for complete search history.

(56) References Cited

U.S. PATENT DOCUMENTS

| | | | | |
|---|---|---|---|---|
| 5,914,893 | A | 6/1999 | Kozicki et al. | 365/107 |
| 5,925,415 | A | 7/1999 | Fry et al. | 427/304 |
| 6,084,796 | A | 7/2000 | Kozicki et al. | 365/153 |
| 6,111,264 | A | 8/2000 | Wolstenholme et al. | 257/3 |
| 6,189,582 | B1 | 2/2001 | Reinberg et al. | 143/239 |
| 6,348,365 | B1 | 2/2002 | Moore et al. | 438/130 |
| 6,375,062 | B1 | 4/2002 | Higdon et al. | 228/214 |
| 6,503,830 | B2 | 1/2003 | Miyata | 438/637 |
| 6,518,198 | B1 | 2/2003 | Klein | 438/758 |
| 6,638,820 | B2 | 10/2003 | Moore | 438/256 |
| 6,653,193 | B2 | 11/2003 | Gilton | 438/286 |
| 6,660,136 | B2 | 12/2003 | Li et al. | 204/192.17 |
| 6,709,887 | B2 | 3/2004 | Moore et al. | 438/95 |

(Continued)

OTHER PUBLICATIONS

Wolf and Tauber; Silicon Processing for the VLSI ERA vol. 1: Process Technology; p. 161; Lattice Press, 1986; Sunset Beach, California.*

Primary Examiner—Fernando L. Toledo
(74) Attorney, Agent, or Firm—Whyte Hirschboeck Dudek SC

(57) ABSTRACT

Non-volatile, resistance variable memory devices, integrated circuit elements, and methods of forming such devices are provided. According to one embodiment of a method of the invention, a memory device can be fabricated by depositing a chalcogenide material onto a first (lower) electrode, sputter depositing a thin diffusion layer of a conductive material over the chalcogenide material, diffusing metal from the diffusion layer into the chalcogenide material resulting in a metal-comprising resistance variable material, and then plating a conductive material to a desired thickness to form a second (upper) electrode. In another embodiment, the surface of the chalcogenide layer can be treated with an activating agent such as palladium, a conductive metal can be electrolessly plated onto the activated areas to form a thin diffusion layer, metal ions from the diffusion layer can be diffused into the chalogenide material to form a resistance variable material, and a conductive material plated over the resistance variable material to form the upper electrode. The invention provides a process for controlling the diffusion of metal into the chalcogenide material to form a resistance variable material by depositing the mass of the upper electrode by a metal plating technique.

28 Claims, 8 Drawing Sheets

U.S. PATENT DOCUMENTS

| | | | |
|---|---|---|---|
| 6,709,958 B2 | 3/2004 | Li et al. | 438/513 |
| 6,710,423 B2 | 3/2004 | Moore et al. | 257/528 |
| 6,727,192 B2 | 4/2004 | Moore et al. | 438/795 |
| 6,730,547 B2 | 5/2004 | Li et al. | 438/128 |
| 6,751,114 B2 | 6/2004 | Gilton et al. | 365/100 |
| 6,784,018 B2 | 8/2004 | Campbell et al. | 438/102 |
| 6,800,504 B2 | 10/2004 | Li et al. | 438/102 |
| 6,812,087 B2 | 11/2004 | Giltom et al. | 438/238 |
| 6,881,623 B2 | 4/2005 | Campbell et al. | 438/257 |
| 6,955,940 B2 | 10/2005 | Campbell et al. | 438/95 |
| 2002/0098711 A1 | 7/2002 | Klein | 438/758 |
| 2002/0123248 A1* | 9/2002 | Moore et al. | 438/795 |
| 2002/0168852 A1 | 11/2002 | Harshfield et al. | 438/650 |
| 2003/0027416 A1 | 2/2003 | Moore | 438/618 |
| 2003/0153143 A1 | 8/2003 | Klein | 438/200 |
| 2003/0215978 A1 | 11/2003 | Maimon et al. | 438/95 |

* cited by examiner

ELECTRO-AND ELECTROLESS PLATING OF METAL IN THE MANUFACTURE OF PCRAM DEVICES

CROSS-REFERENCE TO RELATED APPLICATION

This application is a division of U.S. Ser. No. 09/956,783, filed Sep. 20, 2001 now U.S. Pat. No. 7,109,056.

FIELD OF THE INVENTION

The present invention relates generally to semiconductor fabrication techniques and, more particularly, to a method for fabricating electrodes for use in phase changeable or resistance variable memory devices such as, for example, chalcogenide-based memory cells.

BACKGROUND OF THE INVENTION

Memory devices are used in integrated circuitry to store information in the form of binary data. There are various types of memory devices including volatile semiconductor memory in which stored data is retained as long as power to the system is not turned off, such as dynamic random access memories (DRAMs). Non-volatile memories, such as read-only memories (ROMs), retain stored data even when power is discontinued, but have less storage capability and programming options than volatile memories. Although there are non-volatile memories such as programmable read-only memory (PROMs) and electrically-erasable PROM (EE-PROMs) that permit limited reprogramming, there are limits on the programming capacity of such memory devices.

Programmable metallization cells (PMCs) comprise a fast ion conductor or resistant variable material, typically a chalcogenide material having metal ions therein, which is disposed between two electrodes comprising an electrically conducting material (e.g., an anode and a cathode), as described, for example, in U.S. Pat. No. 6,084,796 (Kozicki et al., Axon Technologies). Resistant variable materials (or fast ion conductors) are capable of assuming a high resistance "off" and a low resistance "on" state in response to a stimulus for a binary memory, and multiple generally stable states in response to a stimulus for a higher order memory. The resulting memory element is non-volatile in that it will maintain the integrity of the information stored by the memory cell without the need for periodic refresh signals, and the data integrity of the information stored by these memory cells is not lost when power is removed from the device.

The resistant variable material (e.g., chalcogenide-metal ion material) undergoes a chemical and structural change at a certain applied voltage. Specifically, at a threshold voltage, plating of metal from metal ions occurs. A metal dendrite grows within the chalcogenide-metal ion material, eventually connecting the two electrodes. The growth rate of the dendrite is a function of the applied voltage and time. The growth of the dendrite can be stopped by removing the voltage or the dendrite can be retracted back towards the cathode by reversing the voltage polarity at the anode and cathode.

Changes in the length of the dendrite affect the resistance and capacitance of the PMC. If dendrite growth is continued until it effectively interconnects the electrodes to electrically short them together, a drop in the resistance of the resistance variable material results. The resistance variable material can be returned to a highly resistive state by reversing the voltage potential between the anode and cathode, whereupon the dendrite is disrupted. Thus, such a device can function as a programmable memory cell of a memory circuitry.

An exemplary resistance variable material comprises germanium selenide with silver ions diffused therein. Current methods provide silver ions within the germanium selenide material by initially depositing the germanium selenide glass layer onto a substrate, typically a first electrode, and then depositing a thin overlying layer of silver, typically by physical vapor deposition (i.e., sputtering). The thin silver layer is then exposed to electromagnetic energy such as ultraviolet (UV) radiation to diffuse silver into the germanium selenide layer, such that a homogenous distribution of silver throughout the layer is ultimately achieved. In an exemplary embodiment, the upper electrode is then formed from silver that is sputter deposited onto the metal-doped germanium selenide layer.

In the process of depositing silver to form the upper electrode, plasma generated during sputtering results in the generation of electromagnetic radiation, which drives additional silver into the metal-doped material. Although some doping of silver into the material is needed to provide a working device whereby silver from silver ions within the material plates out to grow the dendrite extension between the two electrodes, the amount of electromagnetic radiation generated during the sputtering process can drive excessive amounts of silver into the resistance variable material such that the device is rendered non-functional.

Therefore, a need exists for a process for fabricating memory cells comprising a resistance variable material that avoids such problems.

SUMMARY OF THE INVENTION

The present invention relates generally to semiconductor fabrication techniques and, more particularly, to non-volatile, resistance variable memory devices such as, for example, chalcogenide memory cells, and methods of forming such devices, and more particularly to the fabrication of electrodes on resistance variable materials of an integrated circuit element.

In one aspect, the invention provides methods of forming a memory device comprising a resistance variable material interposed between an upper and a lower electrode. In an embodiment of a method according to the invention, a lower electrode layer is formed on a substrate, a chalcogenide material is deposited onto the lower electrode, and a thin diffusion layer comprising a conductive metal, such as silver, is formed over the chalcogenide material for example, by physical vapor deposition (i.e., sputtering) or by chemical vapor deposition (CVD), and then a conductive metal is plated onto the diffusion layer to a desired thickness to form the upper electrode. Metal ions from the diffusion layer are diffused into the chalcogenide material prior to plating the upper electrode, resulting in a metal-comprising resistance variable material. In another embodiment, a thin seed layer of conductive metal is deposited onto the resistance variable material layer and/or the diffusion layer, followed by plating of a conductive metal to form the upper electrode.

In an exemplary embodiment of the method, a layer of germanium selenide material is deposited, for example, by chemical vapor deposition or sputtering, onto a lower electrode layer that can comprise, for example, silver, tungsten, platinum, or other conductive material. A silver material is sputter deposited onto the germanium selenide layer to form a thin diffusion layer, preferably to a thickness of at least about 100 angstroms to about 300 angstroms or less. The diffusion layer can then be exposed to electromagnetic radiation or other diffusion source to diffuse silver ions into the germanium selenide layer to form the resistance variable material. A conformal layer of a conductive material such as silver is then plated over the diffusion layer by an electroplating or an electroless plating process to a desired thickness to form the upper electrode, typically about 500 to about 2000 angstroms. A seed layer can be deposited as a base for the upper electrode deposition, if appropriate.

In another embodiment of a method of the invention, the upper electrode is formed over a chalcogenide material by first contacting the chalcogenide material with a surface activating agent to form an activated surface area, and then electroless plating a conductive metal (e.g., silver) onto the activated surface area to form a thin diffusion layer. An exemplary surface activating agent is palladium. Metal ions from the plated diffusion layer can then be diffused into the chalcogenide material, resulting in a metal-comprising resistance variable material. The upper electrode is then formed by electroless plating or electroplating a conductive material (e.g., silver) to a desired thickness over the diffusion layer. A thin seed layer, if appropriate, can be deposited by plating prior to plating of the upper electrode.

In another aspect, the invention provides methods of diffusing metal ions into a chalcogenide material to form a resistance variable material. One embodiment of the method comprises sputter or CVD depositing a conductive metal material onto a chalcogenide material to form a thin diffusion layer, and treating the diffusion layer to diffuse metal ions from the conductive metal material into the chalcogenide material, for example, by exposure to electromagnetic radiation. In another embodiment of a method of diffusing metal into a chalcogenide material to form a resistance variable material, the chalcogenide material is contacted with a surface activating agent to form an activated surface area thereon, a layer of metal is plated onto the activated surface area by an electroless plating process to form a diffusion layer of about 100 to about 300 angstroms, and metal ions from the diffusion layer can then be diffused into the chalcogenide material such as by exposure to electromagnetic radiation. In either embodiment, a layer of a conductive metal material can then be plated onto the diffusion layer to a desired thickness to form the upper electrode by electroplating or electroless plating techniques. In another embodiment, a thin seed layer can be deposited as a base layer prior to plating the metal electrode layer. In an exemplary embodiment, the chalcogenide material comprises germanium selenide, and both of the diffusion layer and the electrode layer comprise silver. The diffusion layer is preferably deposited to a thickness of about 100 to about 300 angstroms.

In another aspect, the invention provides a semiconductor circuit comprising a semiconductor structure comprising a resistance variable material interposed between and in electrical contact with first and second electrodes. The resistance variable material comprises a chalcogenide material having metal ions dispersed therethrough. In one embodiment of the semiconductor circuit, a diffusion layer comprising a sputter deposited (or CVD deposited) conductive metal is disposed over the resistance variable material, and a plated layer of a conductive metal overlies the diffusion layer to form the second (upper) electrode. The conductive metal forming the second (upper) electrode can also be plated onto a thin seed layer of a conductive metal that is deposited onto the diffusion layer and/or the resistance variable material. The resistance variable material can be disposed within an opening through an insulative layer that overlies the first electrode.

In another embodiment of a semiconductor circuit, the semiconductor structure comprises a resistance variable material comprising a metal-chalcogenide material, sandwiched between an upper and lower electrode. A thin diffusion layer of an electrolessly plated conductive metal is disposed over an activated surface area overlying the resistance variable material, and a plated conductive metal layer overlies the diffusion layer to form the upper electrode. The activated surface area comprises a surface activating agent, for example, palladium. If appropriate, the plated conductive metal layer forming the upper electrode can overlie a plated seed layer of a conductive metal disposed over the diffusion layer and/or the resistance variable layer.

In yet another aspect, an integrated circuit is provided. In one embodiment, the integrated circuit comprises a substrate; a first electrode comprising a conductive material formed over the substrate; an insulating dielectric layer (if appropriate) formed over the first electrode with an opening formed into the insulating layer to expose the first electrode; a layer of a resistance variable material comprising a metal-chalcogenide material (formed in the opening) in electrical contact with the first electrode; a sputtered or CVD deposited diffusion layer overlying the resistance variable material; and a second electrode plated onto the diffusion layer or a thin seed layer (where appropriate). Where appropriate, an insulating dielectric layer is formed over the substrate and the first electrode is formed over the insulating layer. In a preferred embodiment, the chalcogenide material comprises germanium selenide, the diffusion layer comprises silver and is preferably about 100 to about 300 angstroms thick, and the plated electrode layer comprises a solid silver layer.

In another embodiment of an integrated circuit according to the invention, the circuit comprises a substrate; a first electrode comprising a conductive material formed over the substrate; an insulating dielectric layer (if appropriate) formed over the first electrode with an opening formed into the insulating layer to expose the first electrode; a layer of a resistance variable material comprising a metal-chalcogenide material (formed in the opening) in electrical contact with the first electrode; an activated surface area formed over the resistance variable material and comprising a surface activating agent; an electrolessly plated diffusion layer formed over the activated surface area of the resistance variable material; and a second plated conductive metal formed over the diffusion layer to form an upper electrode. The conductive metal of the second electrode can be plated onto a metal seed layer. In a preferred embodiment, the chalcogenide material comprises germanium selenide, the surface activating agent comprises palladium, the diffusion layer comprises electrolessly plated silver, and the second electrode comprises a plated silver layer.

Conventional methods of diffusing metal into the chalcogenide material to form a resistance variable material layer, and then sputter depositing the upper electrode over the layer, results in excess metal ions being diffused into the chalcogenide material and a failed device. Advantageously, the present methods of sputtering (or CVD depositing) a very thin metal (e.g., silver) diffusion layer onto the surface of the chalcogenide layer or electrolessly plating a diffusion layer onto the activated surface of the chalcogenide layer, and then plating additional metal over the diffusion layer to form the upper electrode is useful in controlling and reducing the diffusion of metal ions into the chalcogenide material and in forming memory devices comprising a resistance variable element that are operable and functional.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 3A'-3C' are cross-sectionals view of SEMs of the corresponding Controls for FIG. 3C.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above. The terms "fast ion conductor" and/or "resistance variable material" refer to a metal ion-containing glass, a metal ion-containing amorphous semiconductor, a chalcogenide-metal ion, a superionic conductor, and the like.

FIGS. 1A through 1E depict a method of forming a non-volatile resistance variable memory device according to a first embodiment of a method of the invention.

Figure 1A:
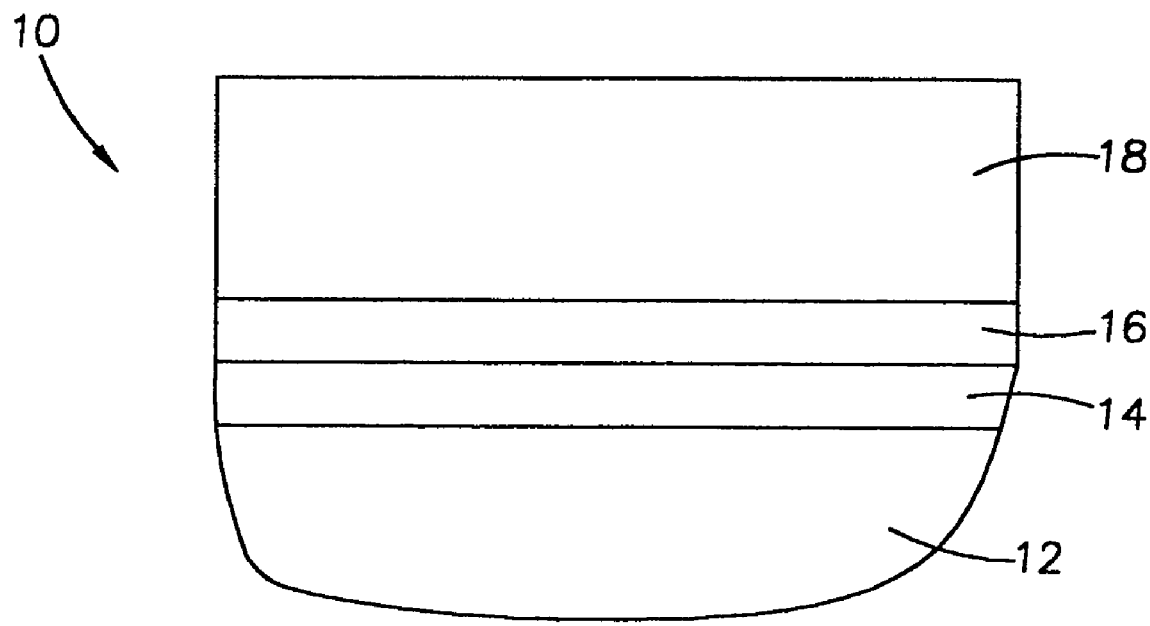
FIG. 1A is a diagrammatic cross-sectional view of a semiconductor wafer fragment at a preliminary step of a processing sequence.

Referring to FIG. 1A, a wafer fragment 10 is shown at a preliminary processing step in the formation of a resistance variable memory device. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 comprises a substrate 12 such as plastic, glass or semiconductor material, to provide support for the device. If appropriate, an overlying insulating layer 14 such as silicon dioxide, is provided to insulate the substrate 12 from the active portion of the device. A lower electrode 16 is formed over the insulating layer 14 (or over the substrate 12 if no insulator is used). The lower electrode can be formed on the insulating layer or substrate by methods known and used in the art. For example, the lower electrode can be formed by depositing a thin metal seed layer or by activating the surface using an activating agent such as palladium ($PdCl_2$) and then depositing a conductive metal to form the lower electrode by electro- or electroless plating. The lower electrode 16 can constitute a patterned line over the insulating layer, and preferably comprises silver or other conducting material such as nickel, chromium, cobalt, molybdenum, tungsten, palladium, platinum, aluminum, titanium, copper, and carbon, or combinations and mixtures thereof, being tungsten in the illustrated example.

In an exemplary embodiment, a chalcogenide material 18 is deposited onto the lower electrode 16, as depicted in FIG. 1A. Chalcogenide materials are known in the art and include, but are not limited to, compounds having the formula $B_xA_y$ where "B" is arsenic (As) or germanium (Ge), and where "A" is selenium (Se), tellurium (Te), sulfur (S), or a mixture thereof. A preferred chalcogenide material 18 is represented by the formula $Ge_xA_y$, and includes, for example, germanium sulfide and germanium selenide. Another example of a chalcogenide material is represented by the formula $As_xA_y$, and includes, for example, arsenic sulfide and arsenic trisulfide ($As_2S_3$). The chalcogenide material 18 can be formed over the lower electrode 16 by methods known and used in the art, for example, by chemical vapor deposition, physical vapor deposition, or evaporation.

Figure 1B:
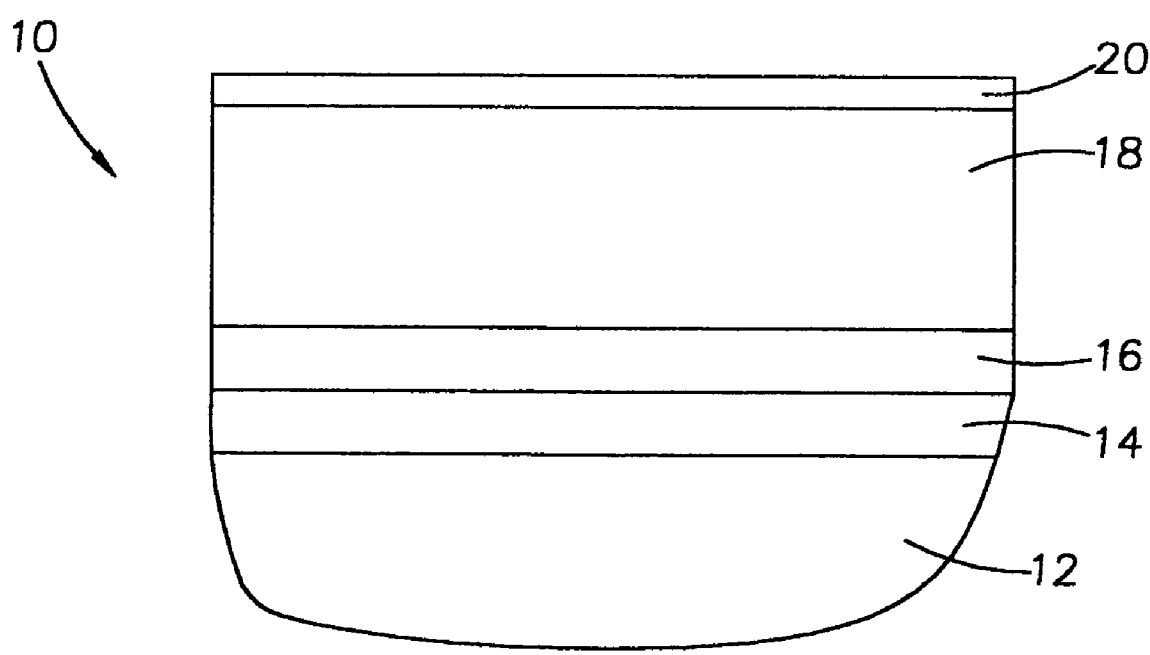
FIGS. 1B through 1E are views of the wafer fragment of FIG. 1A at subsequent and sequential processing steps, showing fabrication of an electrode according to an embodiment of the method of the invention.

According to the presently described embodiment of a method of the invention, a thin diffusion layer 20 is initially deposited onto the chalcogenide material 18, as depicted in FIG. 1B. The diffusion layer 20 can be deposited by chemical vapor deposition (CVD), and is preferably deposited by a conventional physical vapor deposition (i.e., sputtering) process. The diffusion layer 20 can comprise a conducting material, for example, silver, copper or zinc, being silver in the illustrated example.

As discussed above, sputter deposition of metal such as silver onto a germanium selenide or other chalcogenide material can result in excess diffusion of metal ions into the chalcogenide material due to UV radiation generated during prolonged sputtering, resulting in a failed device component. Therefore, it is desirable to limit the thickness of the sputtered diffusion layer 20 to lessen the amount of UV radiation that is generated, and minimize the diffusion of silver or other metal into the underlying chalcogenide material 18. The thickness of the diffusion layer 20 is preferably at least about 100 angstroms to about 300 angstroms.

Figure 1C:
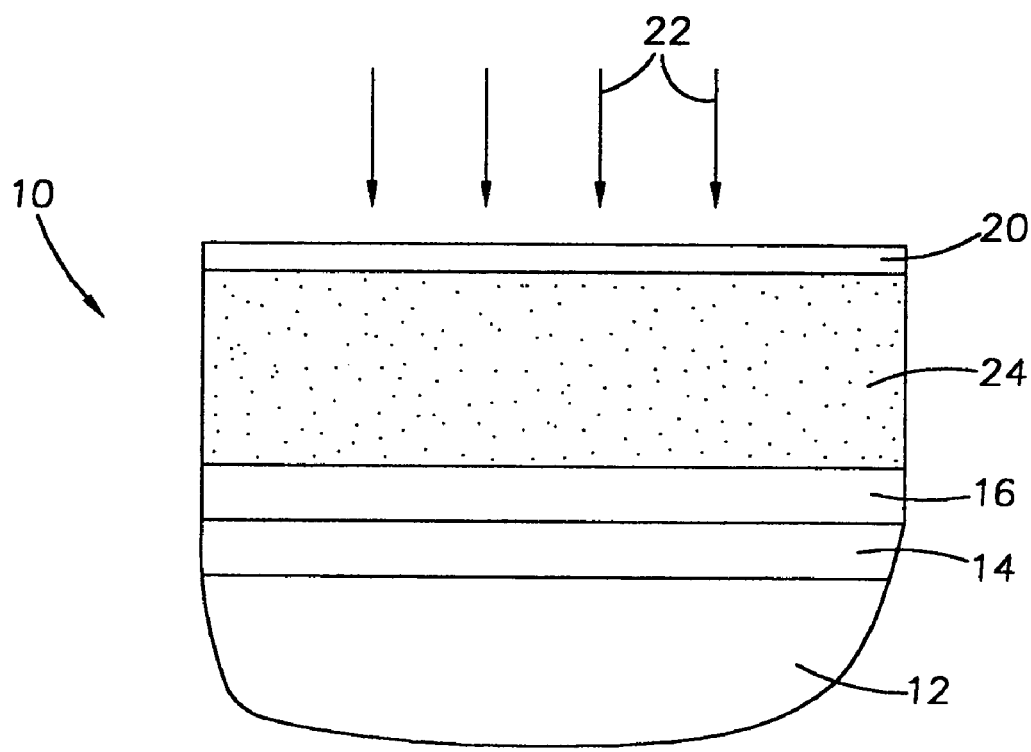

In the illustrated embodiment, the deposited silver diffusion layer 20 can then be treated by exposure to electromagnetic radiation or other diffusion source 22 to diffuse silver ions from the diffusion layer 20 into the underlying chalcogenide layer 18, resulting in the metal-comprising resistance variable material or fast ion conductor layer 24, as depicted in FIG. 1C. The substrate can also be heated during an irradiation process, for example, to a temperature of about 65° C. to about 100° C. Since the present method forms the upper electrode 28 by limiting sputtering of silver or other metal to forming the thin diffusion layer 20 and plating the mass of the upper electrode, little electromagnetic radiation is produced during the formation of the upper electrode such that only a minimal amount of metal ions is driven into the resistance variable material layer 24 during the formation of the upper electrode.

Figure 1D:
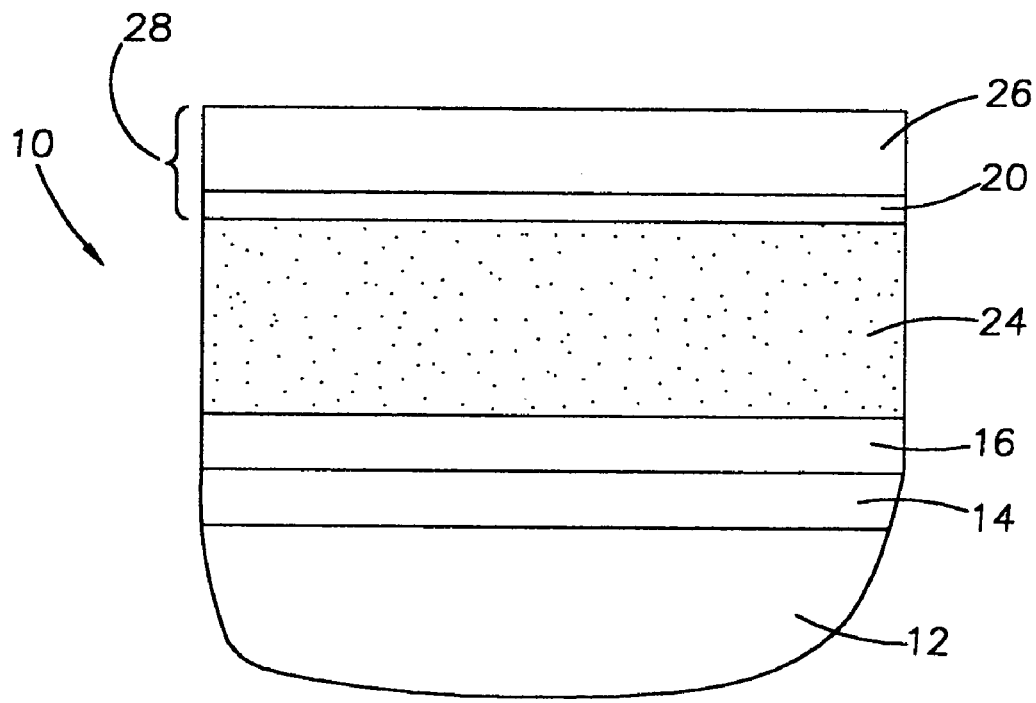

A conformal metal layer 26 is then plated over the diffusion layer 20, as depicted in FIG. 1D, to form the upper electrode 28. A conventional electroplating process or an electroless plating process can be used. Where the diffusion layer 20 has been consumed during the diffusing step of the metal ions and is less than about 100 angstroms, it is desirable to deposit a thin seed layer (not shown) onto the resistance variable material layer 24 (or remainder of the diffusion layer) to form a base for the subsequent deposition of the upper electrode. The seed layer can be deposited by CVD or PVD, but is preferably a plated layer. The upper electrode 28 preferably comprises silver or other conductive material such as copper, zinc, or platinum, among others, being silver in the illustrated example. The diffusion layer 20 (or seed layer) and the plated electrode layer 28 can comprise the same metal, or different metals if adherent to each other. Preferably, the diffusion layer 20 (or seed layer) and the plated electrode layer 26 comprise the same metal to achieve a high level of adhesion and conductivity between the two layers. Formation of the conformal electrode layer 26 progresses uniformly from the diffusion layer 20 (or seed layer if used) by the attachment or fusing of metal from the plating solution to the diffusion layer 20 (or seed layer).

In an example of a suitable silver electroplating process, the wafer 10 is immersed in a bath comprising an aqueous solution of a silver salt such as silver nitrate ($AgNO_3$), potassium silver cyanide ($KAg(CN)_2$) or silver succinimide ($C_4H_5O_2NAg$). Such silver plating baths are commercially available and used in the art. One preferred solution is a cyanide-free silver plating solution comprising silver succinimide ($C_4H_5O_2NAg$), which is available commercially under the trade name Techni-Silver CY-LESS® L2 from Technic, Inc., Cranston, R.I.

A current is applied to reduce the metal ions and deposit a silver metal electrode layer 26 onto the silver diffusion layer 20. The substrate remains immersed in the solution bath and the current is applied until the desired thickness of silver is obtained, preferably a thickness of about to 400 to about 1500 angstroms, or a total thickness (layers 20 and 26) of about 500 to about 2000 angstroms. Preferably, the coating solution is gently agitated to more uniformly plate the electrode on the surface of the resistance variable material layer 24.

The current is terminated when the desired thickness is reached, and the substrate is placed into a water rinse bath to remove residual bath liquid and particles from the surface of the wafer and then dried. The substrate is then immersed in an organic solvent such as acetone or an alcohol such as ethanol or isopropanol that is miscible with the rinse liquid and with water, and then spin dried.

In another embodiment of a plating system, an electroless plating process can also be used to deposit a conformal metal electrode layer 26 (e.g., silver, copper) to form the upper electrode 28. In an exemplary electroless plating process for forming a silver electrode, the substrate is immersed in a bath comprising an aqueous solution of a silver salt (e.g., $AgNO_3$, $KAg(CN)_2$), a chemical reducing agent, and optional additives as known and used in the art to control stability, film properties, deposition rates, and to build up the metal coating. The metal ions are reduced by reaction with the chemical reducing agent in the plating solution and, as depicted in FIG. 1D, deposit as a silver electrode layer 26 onto the silver diffusion layer 20 to a desired thickness.

A preferred chemical reducing agent for use with a silver electroless plating process comprises a mixture of glucose and tartaric acid in a ratio (g/g) of about 1:0.1. Examples of other suitable chemical reducing agents include organic and inorganic compounds such as potassium hypophosphite, ammonium hypophosphite, aldehydes such as formaldehyde and glyoxal, potassium borohydride, amine boranes, hydrazine, hydrazine sulfate, Rochelle salt (potassium sodium tartrate), ascorbic acid, and the like.

Optional additives can be added to increase the rate of deposition, increase the stability of the bath, and/or function as a buffer or mild complexing agent. Examples of suitable additives include acetic acid, sodium acetate, sodium fluoride, lactic acid, propionic acid, sodium pyrophosphate, ethylenediamine, thallous nitrate, boric acid, citric acid, hydrochloric acid, malonic acid, glycine, malic acid, mercaptobenzothiazole, sodium lauryl sulfate, lead (II) ion, sodium potassium tartrate, ammonium hydroxide, potassium hydroxide, sodium hydroxide, sodium carbonate, ethylendiaminetetraacetic acid, mercaptobenzothiazole, methyldichlorosilane and tetrasodium ethylenediaminetetraacetic acid, sodium citrate, ammonium chloride, ammonium sulfate, sodium lauryl sulfate, sodium succinate, sodium sulfate and the like, and mixtures thereof.

In a silver electroless plating process, the thickness of the upper electrode 28 is controlled by the length of time that the substrate is immersed in the aqueous coating solution. Preferably, the substrate is immersed in the bath to deposit a quantity of silver onto the seed layer 20 to a thickness of about 400 to about 1500 angstroms, or a total thickness (diffusion layer 20+electrode layer 26) of about 500 to about 2000 angstroms. The solution can be gently agitated to more uniformly and efficiently deposit silver onto the diffusion layer 20 to form the electrode layer 26.

To terminate the metal deposition in an electroless plating, the substrate is removed and placed in a rinse bath. The rinse bath can comprise water, an alcohol such as ethanol or isopropanol, or other organic liquid that is chemically inert to the silver coating and will displace the coating solution from the substrate surface. The substrate is held in the rinse bath until the coating solution has been displaced. Preferably, the rinse solution is gently agitated to more rapidly remove the coating solution from the surface. After rinsing, the substrate can be removed from the rinse bath and allowed to dry, or can be spin dried.

Figure 1E:
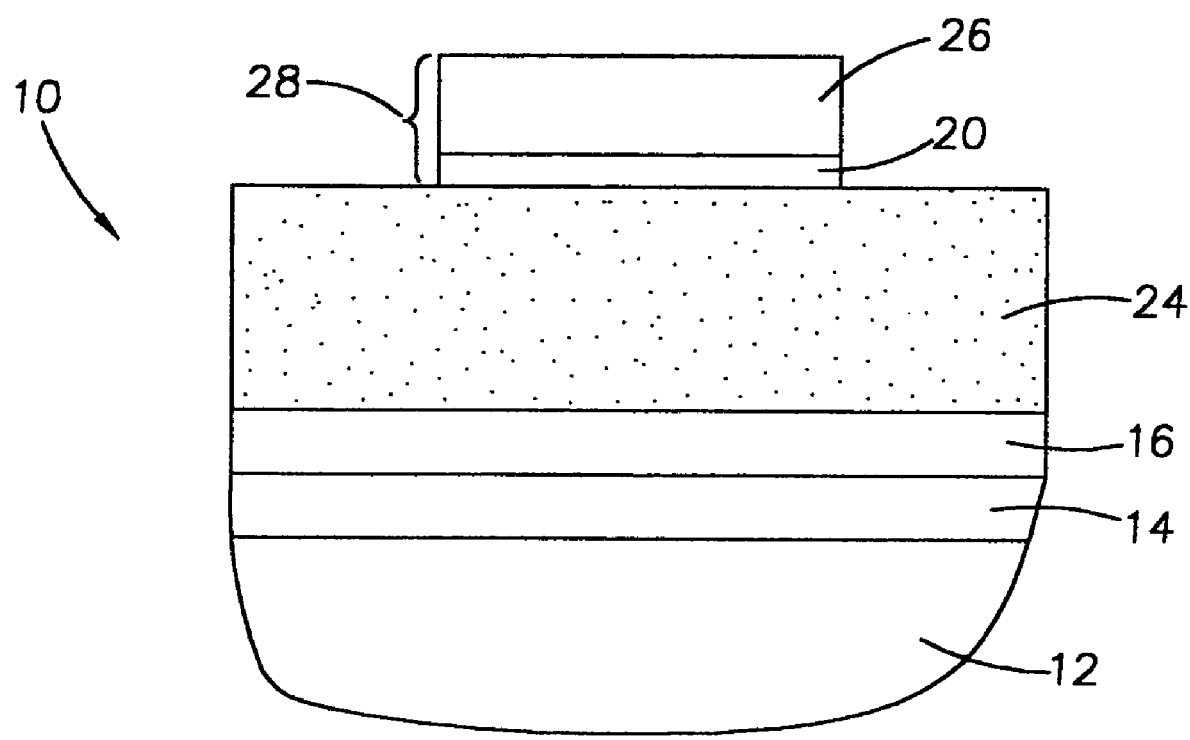

The electrode layer 26 (and diffusion layer 20) can then be patterned to form the upper electrode 28, as depicted in FIG. 1E, by conventional photolithography processing using a photoresist mask and a wet or, preferably, a dry etch procedure. The electrode layer 26 can also be partially removed by conventional chemical mechanical polishing (CMP).

In use, when a voltage is applied, a dendrite (not shown) is formed between the upper and lower electrodes.

According to this embodiment of the method of the invention, the diffusion of metal ions into the chalcogenide material 18 to form the resistance variable material layer 24 is controlled by limiting the silver (or other metal) sputtering step to the formation of a thin diffusion layer, and then depositing the mass of the electrode by plating. The present process controls the diffusion of metal ions into the chalcogenide material to achieve a suitably functional memory device.

Referring now to FIGS. 2A-2F, in another embodiment of a method according to the invention, the surface 36' of the resistance variable material layer 18' is pre-activated and a metal, for example, silver or copper, being silver in the illustrated example, is deposited onto the activated areas by electroless plating to form a diffusion layer 25'. A conformal layer 26' of the same or a different metal can be deposited by electroless or electroplating to form the upper electrode layer 28', also being silver in the illustrated example.

Figure 2A:
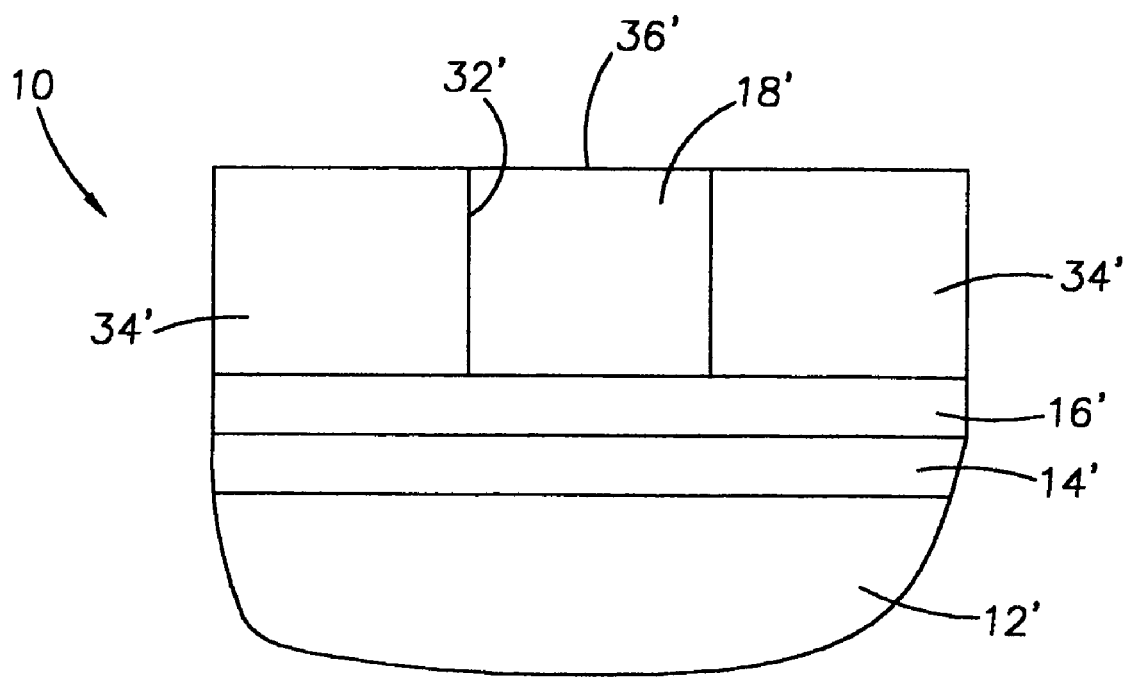
FIG. 2A is a diagrammatic cross-sectional view of a semiconductor wafer fragment at a preliminary step of a processing sequence.

Referring to FIG. 2A, a wafer fragment 10' is shown before processing. Briefly, wafer fragment 10' includes a supportive substrate 12', an overlying insulative layer 14' (if appropriate), a lower electrode layer 16', and an overlying chalcogenide material 18', which is preferably germanium selenide. As depicted, an insulating layer 14' has been formed over the substrate 12', and the chalcogenide material 18' has been deposited within an opening 32' (e.g., via) formed through the insulating layer 34' and overlying the lower electrode 16'.

Figure 2B:
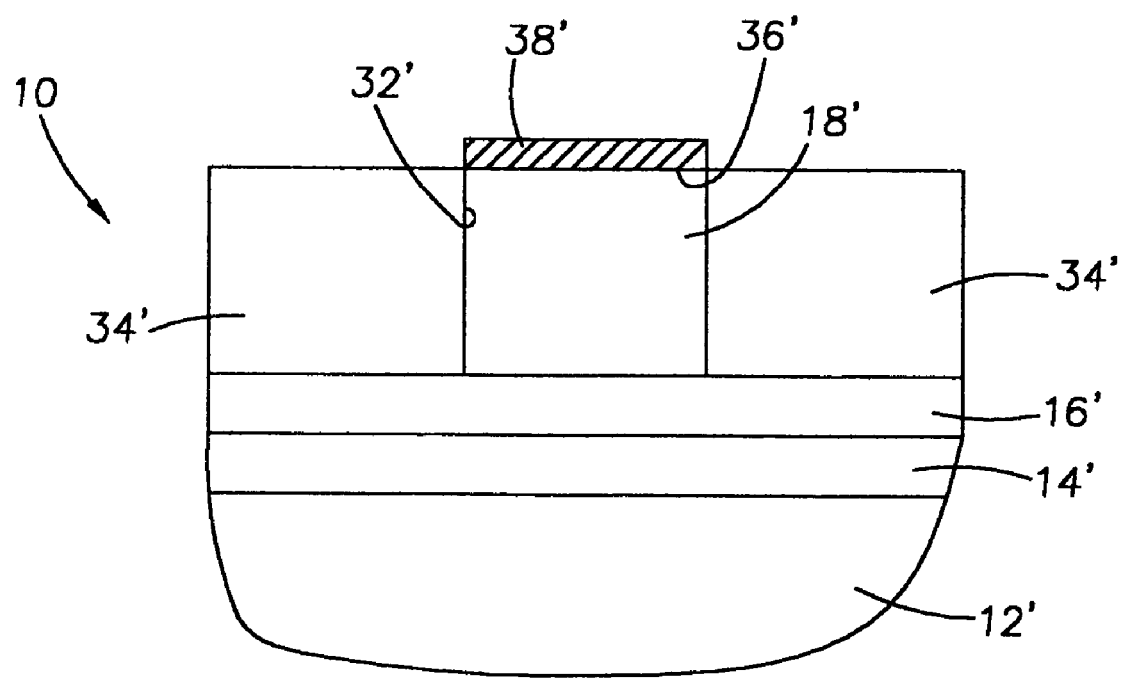
FIGS. 2B through 2F are views of the wafer fragment of FIG. 2A at subsequent and sequential processing steps, showing fabrication of a conductive contact according to another embodiment of the method of the invention.

According to the invention, the surface 36' of the chalcogenide material 18' is contacted with a surface-activating agent to form an activated surface area(s) 38' over layer 18', as depicted in FIG. 2B. The surface-activating agent functions to chemically activate the surface 36' of the chalcogenide material 18' for initiating metal deposition in an electroless plating process. A preferred surface-activating agent comprises a colloidal suspension of palladium (Pd) or palladium chloride ($PdCl_2$) as a catalyst, and a tin (Sn) species such as stannous chloride ($SnCl_2$) as a stabilizer, as known and used in the art. The wafer can be dipped into an aqueous solution comprising the surface-activating agent to coat the chalcogenide material 18', preferably for about 10 to about 150 seconds. A multi-step process can also be used, for example, by dipping the wafer in a $SnCl_2$ solution, rinsing the wafer, and then dipping the wafer in a palladium or $PdCl_2$ solution.

The wafer is then placed into a rinse bath comprising water or other compatible solvent, for example, an alcohol such as ethanol or isopropanol, to remove the surface-activating agent solution. Activated surface areas 38' on the chalcogenide material 18' comprise small island nucleation sites of palladium which initiate deposition of silver thereon in a subsequent silver plating step.

Figure 2C:
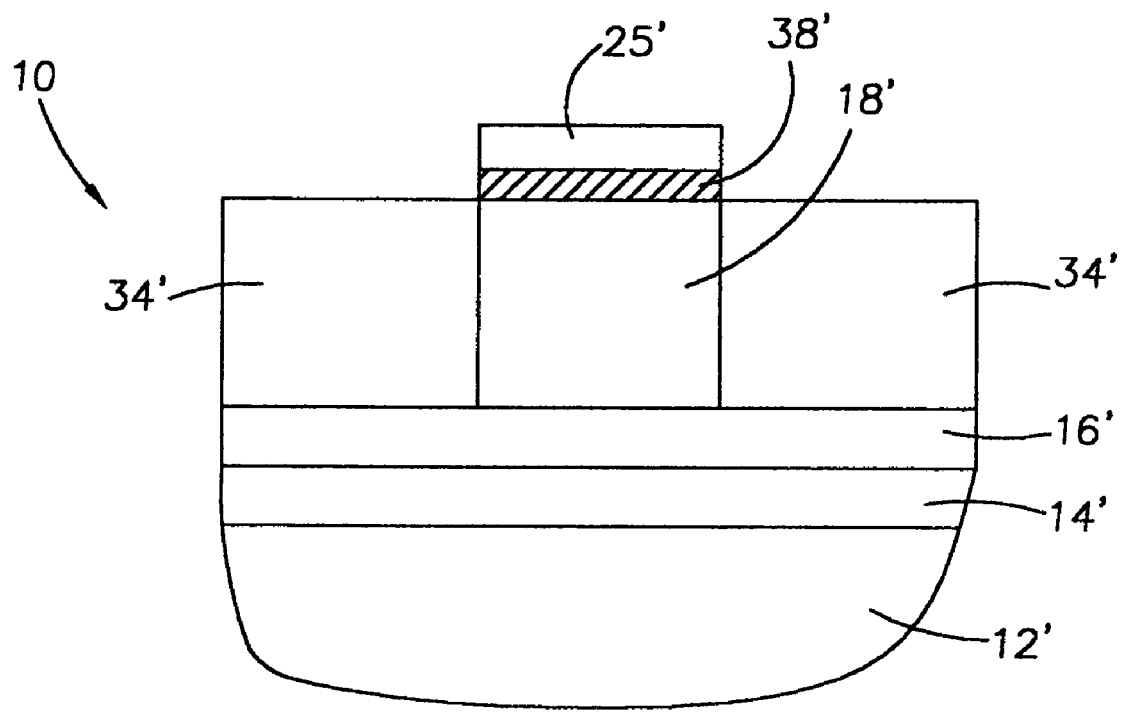

Referring to FIG. 2C, silver is plated as a conformal diffusion layer 25' onto the activated surface areas 38' of the chalcogenide material 18' in an electroless plating process by immersing the substrate in an aqueous bath comprising silver metal ions and a chemical reducing agent, as discussed above. The plating step proceeds until the diffusion layer 25' is formed, preferably to a thickness of about 300 angstroms or less, preferably about 100 to about 300 angstroms. The substrate is then removed from the metal ion bath, placed in a rinse bath to terminate deposition, and dried.

Figure 2D:
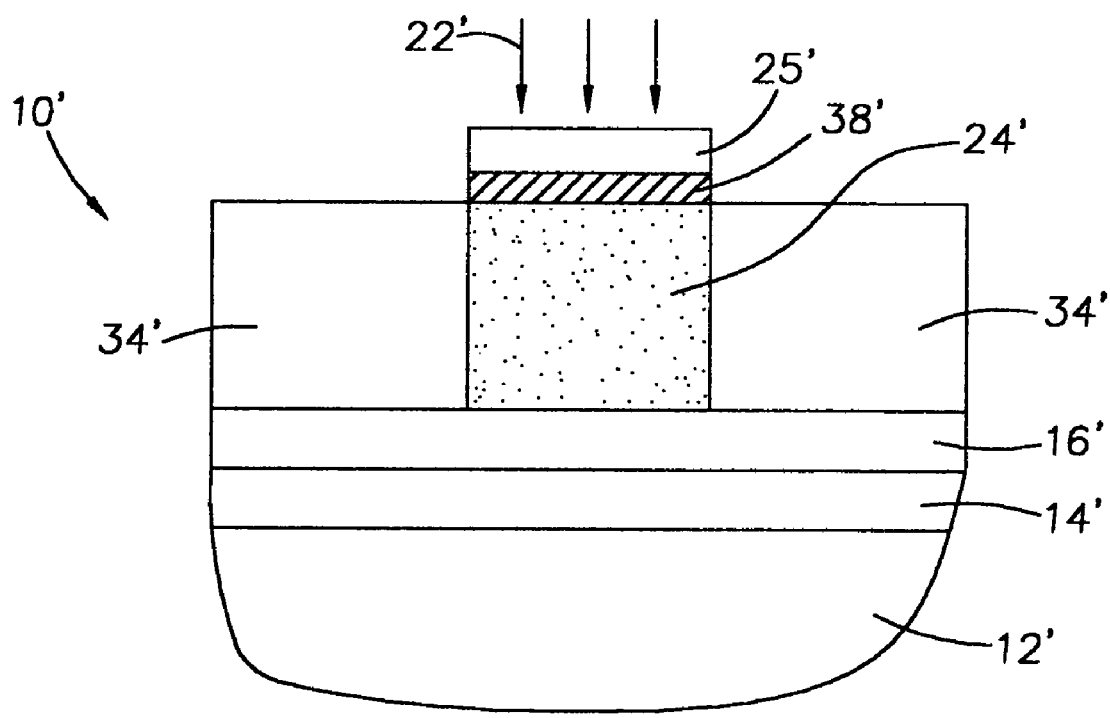

The diffusion layer 25' is then exposed to electromagnetic radiation or other diffusion source 22' to diffuse metal ions (e.g., silver ions) from the diffusion layer 25' into the chalcogenide layer 18', resulting in the resistance variable material layer 24', as depicted in FIG. 2D.

Figure 2E:
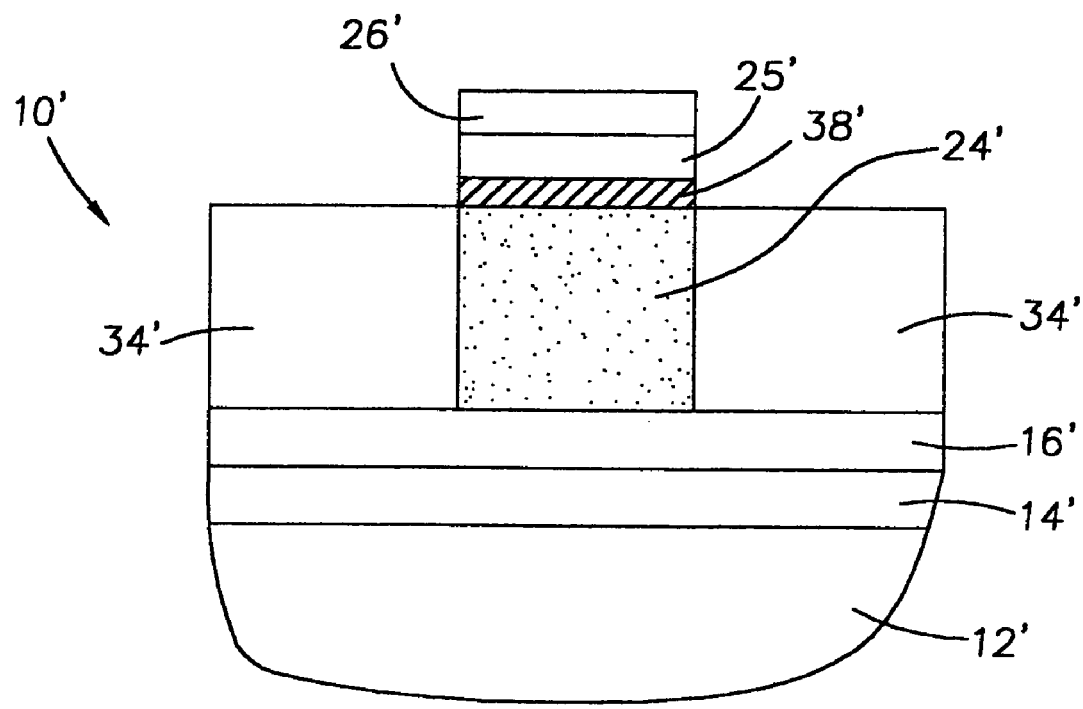

Referring to FIG. 2E, a conformal metal layer 26' is then plated over the diffusion layer 25' in an electroless or electroplating process. The plating step proceeds until a desired mass and thickness is achieved, preferably to a thickness of about 500 to about 2000 angstroms. Where the diffusion layer 25' has been depleted from the foregoing diffusion step, a seed layer (not shown) of a conducting metal can be plated onto the resistance variable material layer 24' as a base for the conformal metal layer 26' of the top electrode. Where the underlying diffusion layer 25' is less than about 100 angstroms, the seed layer is preferably plated using an electroless plating process.

Figure 2F:
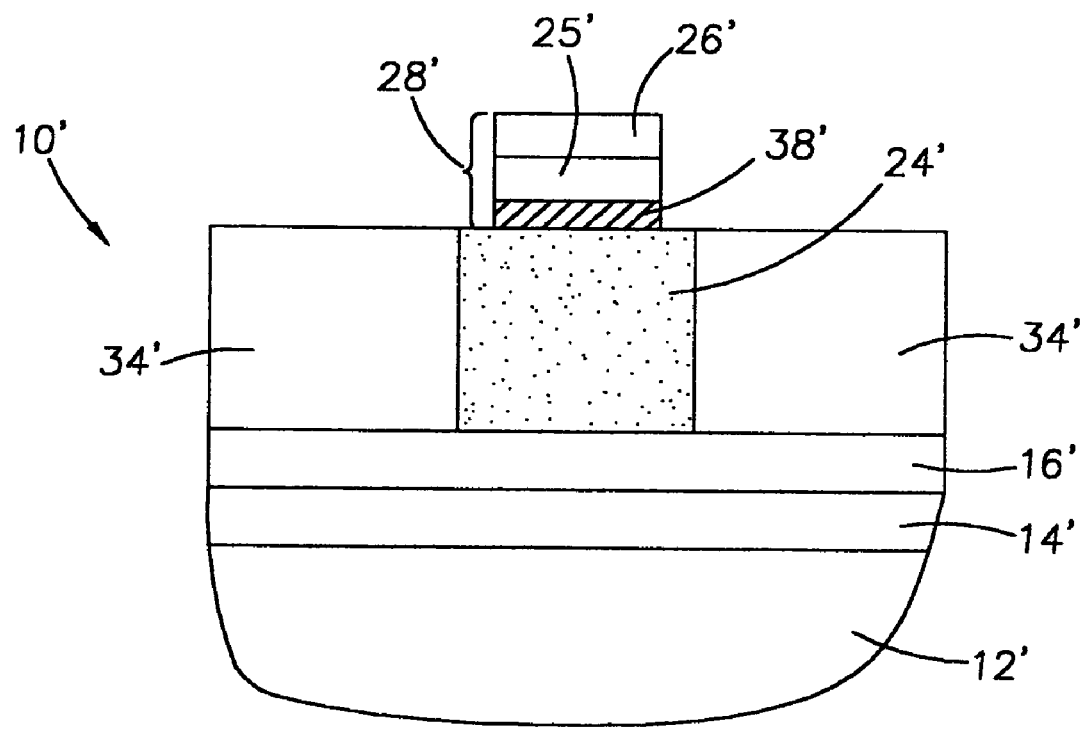

As depicted in FIG. 2F, the conformal metal layer 26' (and diffusion layer 25') can be patterned by conventional photolithographic methods and/or partially removed by conventional CMP to form the upper electrode 28'.

In the present embodiment of the method, diffusion of metal ions into the chalcogenide material to form the resistance variable material layer is controlled by omitting the metal sputtering step and forming the diffusion layer 25' by electroless plating, diffusing metal into the chalcogenide layer 18' from the diffusion layer 25', and then depositing the upper electrode layer 26' by an electroless or electroplating process.

The resulting non-volatile resistance variable devices can be used in a variety of applications including, for example, programmable memory devices, programmable resistor and capacitor devices, optical devices, sensors, among others.

EXAMPLES 1-3

Electroplating of Silver Electrode onto a Silver Seed Layer

A silver electrode was formed over a layer of germanium selenide on a semiconductor wafer according to an embodiment of the method of the invention.

In a series of experimental wafers, the electrode was formed by first sputtering a layer of silver onto the germanium selenide layer to form a seed layer, and then plating silver onto the seed layer for a designated plating time by conventional electroplating using a EG&G model 270 and the processing parameters shown. The thickness of the seed layer varied from 250 angstroms to 400 angstroms.

With the Control wafers, the electrode was formed by sputtering a layer of silver onto the germanium selenide layer to a thickness of 150 to 700 angstroms.

EXAMPLE 1

Figure 3A:
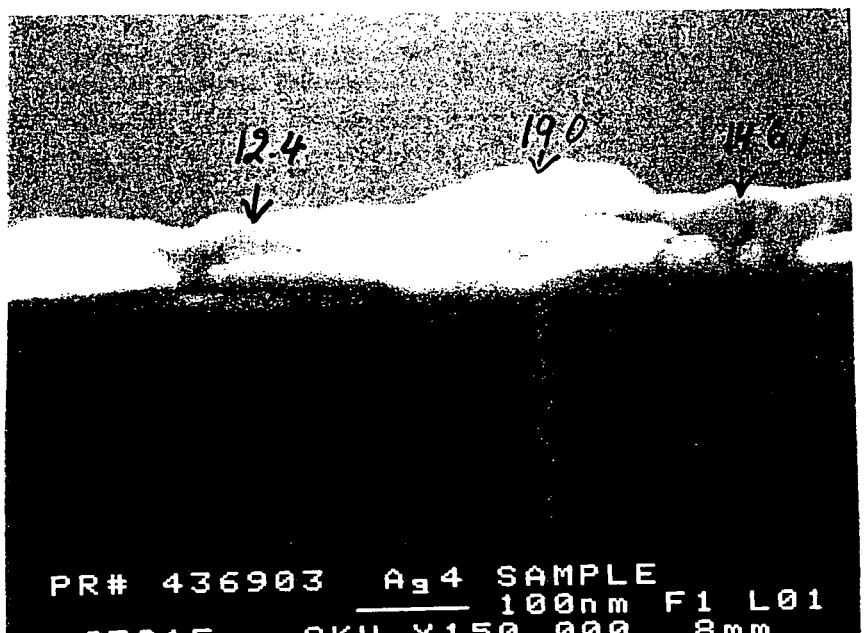
FIGS. 3A-3C are cross-sectionals view of scanning electromicrographs (SEMs) of a series of wafers comprising a germanium selenide layer, an overlying silver diffusion layer and a layer of silver electroplated onto the diffusion layer as described in Example 1.

Solution: 100 ml of Techni-Silver CY-LESS® L2 (Technic, Inc., Cranston, R.I.)
Wafer: ca. 4 cm×5 cm; Ag seed layer thickness=250 Å
Potential: −0.05 V
Plating Time: 120 seconds
Temperature: ambient
Resistance:
    Pre-Plating (avg.): 2.76 ohms/square
    Post-Plating (avg.): 0.66 ohms/square
SEMs: FIG. 3A (Experimental)

EXAMPLE 2

Figure 3B:
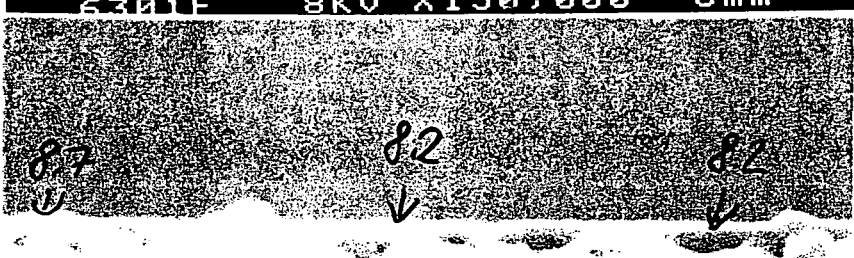

Solution: 100 ml of Techni-Silver CY-LESS® L2 (Technic, Inc., Cranston, R.I.)
Wafer: ca. 4 cm×5 cm; Ag seed layer thickness=150 Å
Potential: −0.05 V
Plating Time: 120 seconds
Temperature: ambient
Resistance:
    Pre-Plating (avg.) 5.7 ohms/square
    Post-Plating (avg.): 1.70 ohms/square
SEMs: FIG. 3B (Experimental)

EXAMPLE 3

Solution: 100 ml of Techni-Silver CY-LESS® L2 (Technic, Inc., Cranston, R.I.)
Wafer: ca. 4 cm×5 cm; Ag seed layer thickness=ca. 600 Å

Figure 3C:
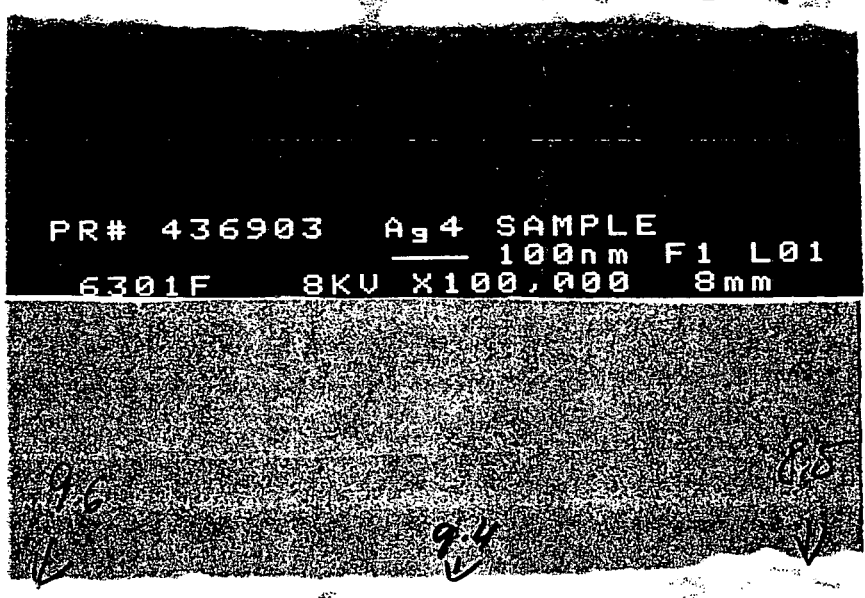
Figure 3A:
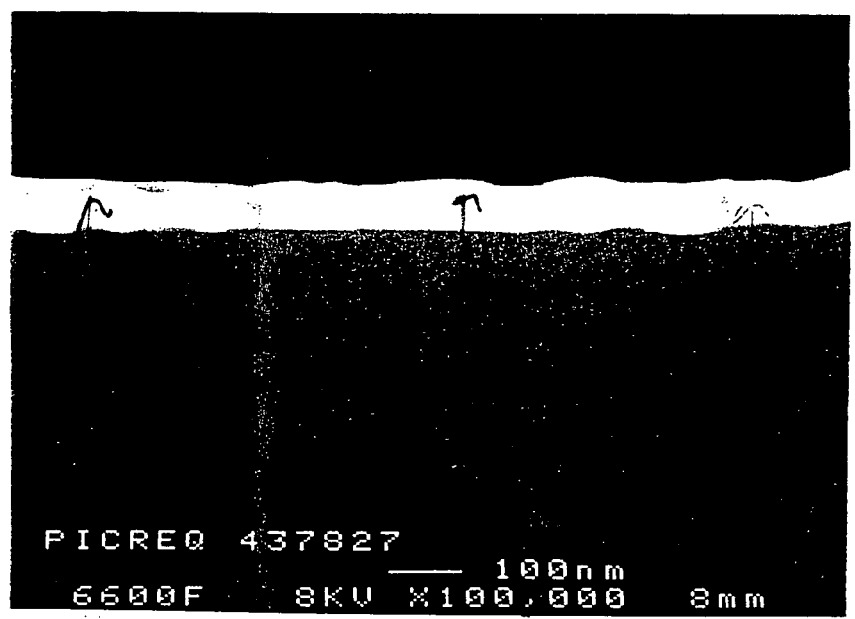
Figure 3B:
Figure 3C:
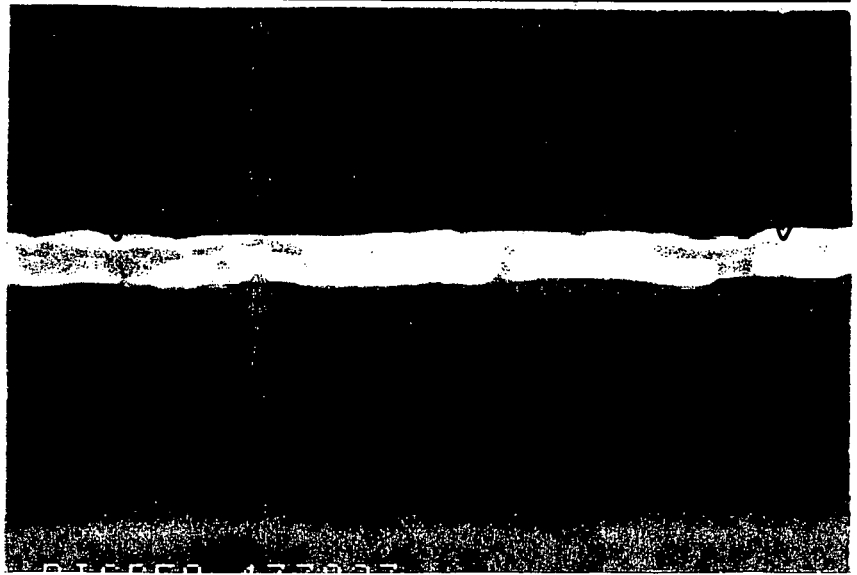

Potential: −0.05 V
Plating Time: 120 sec
Temperature: ambient
Resistance:
  Pre-Plating (avg.): 1.44 ohms/square
  Post-Plating (avg.): 0.96 ohms/square
SEMs: FIG. 3C (Experimental)
  FIGS. 3A', 3B', 3C (Control)

A decrease in resistance is evidence of increased silver thickness, proving that plating was successful. This is demonstrated further by the (SEM) images shown in FIGS. 3A-3C. The results demonstrated that a thin sputtered silver layer can be used as a plating seed to further increase the silver thickness without the generation of electromagnetic radiation.

EXAMPLES 4 and 5

Electroless Plating of Silver Electrode onto a Silver Seed Layer

A silver electrode was formed over a layer of germanium selenide on a semiconductor wafer, according to a method of the invention.

In a series of experimental wafers, a silver electrode was formed by first sputtering a layer of silver onto a germanium selenide layer on a semiconductor wafer, to form a seed layer. The thickness of the seed layer varied from 150 angstroms to 400 angstroms. Silver was then plated onto the seed layer for a designated plating time by conventional electroless plating using the processing parameters shown below.

With the Control wafers, the electrode was formed by sputtering a layer of silver onto the germanium selenide layer on a wafer.

EXAMPLE 4

Plating Solution:
  $AgNO_3$ (0.3 g)
  $NH_4OH$ (0.3 ml)
  KOH (0.5 ml)
  Glucose (3.87 g)
  Tartaric acid (0.35 g)
  Isopropyl alcohol (IPA) (8.75 ml)
  $H_2O$ (total of 92.7 ml)
Wafer: ca. 4 cm×4 cm, Ag seed layer thickness: 200 angstroms.
Plating Time: 300 seconds
Temperature: Ambient to begin with, but plating was very slow. After 15 minutes, the bath was slightly warmed. The bath decomposed upon heating within 15 minutes.
Resistance
  Pre-Plating (avg.): 4.22 ohms/square
  Post-Plating (avg.): 2.52 ohms/square

EXAMPLE 5

Plating Solution:
  $AgNO_3$ (0.35 g)
  $NH_4OH$ (until precipitate dissolved)
  KOH (0.35 ml)
  Glucose (4.50 g)
  Tartaric acid (0.4 g)
  Ethanol (10 ml)
  $H_2O$ (total of 106 ml)
Wafer: ca. 4 cm×4 cm, Ag seed layer thickness: 200 angstroms.
Plating Time: 300 seconds
Temperature: Ambient to begin with, but plating did not seem to start of was very slow. After 15 minutes, the bath was slightly warmed to about 30° C. The bath decomposed upon heating within 30 minutes.
Resistance
  Pre-Plating (avg.): 4.51 ohms/square
  Post-Plating (avg.): 2.37 ohms/square The silver layer formed on the experimental wafers by electroless plating onto the silver seed layer over the germanium selenide layer had an increased thickness as evidenced by the decrease in resistance after plating.

The experimental silver layers also had a greater thickness compared to the corresponding Control wafers. The resistance of the silver layer in the Control wafers was about 4.5 ohms/square (pre-plating), and about 2.3 ohms/square (post-plating). This indicates that the silver thickness increased from about 200 to 300 angstroms.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a memory device, comprising:
   chemical vapor depositing a diffusion layer comprising a metal onto a chalcogenide material layer overlying a first electrode;
   diffusing metal ions from the diffusion layer into the chalcogenide material layer to form a resistance variable material layer; and
   plating a metal onto the resistance variable material layer or overlying remaining diffusion layer to form a second electrode such that the metal ions within the resistance variable material layer are at about the same level as before the plating step.

2. The method of claim 1, wherein the diffusion layer comprises a metal selected from the group consisting of silver, copper, and zinc.

3. The method of claim 1, wherein the diffusion layer comprises silver.

4. The method of claim 1, wherein plating the metal comprises an electroplating process.

5. The method of claim 1, wherein plating the metal comprises an electroless plating process.

6. The method of claim 1, further comprising, prior to plating depositing a metal seed layer over the resistance variable material layer or overlying remaining diffusion layer.

7. The method of claim 1, wherein the second electrode comprises a metal selected from the group consisting of silver, copper, zinc, and platinum.

8. The method of claim 1, wherein the second electrode comprises silver.

9. The method of claim 1, wherein the second electrode comprises copper.

10. The method of claim 1, wherein the second electrode and the diffusion layer comprise the same metal.

11. The method of claim 10, wherein the diffusion layer and the second electrode comprise silver.

12. The method of claim 1, wherein the diffusion layer and the second electrode layer comprise different metals.

13. The method of claim 12, wherein the diffusion layer comprises silver, and the second electrode comprises a metal other than silver.

14. The method of claim 1, wherein diffusing the metal ions into the chalcogenide material comprises exposing the diffusion layer to electromagnetic radiation.

15. A method of forming a memory device, comprising:
physical vapor depositing a diffusion layer comprising a metal onto a chalcogenide material layer overlying a layer of conductive material;
diffusing metal ions from the diffusion layer into the chalcogenide material layer to form a resistance variable material layer comprising an effective level of the metal ions; and
plating a layer of a metal onto the resistance variable material layer or overlying remaining diffusion layer such that the level of the metal ions within the resistance variable material layer remains about the same as before the plating.

16. A method of forming a programmable memory device, comprising
forming a diffusion layer by chemical vapor depositing a first metal onto a chalcogenide material overlying and in electrical contact with a first electrode;
forming the chalcogenide material into a resistance variable material by diffusing metal ions from the diffusion layer into the chalcogenide material; and
forming a second electrode by plating a second metal onto the resistance variable material layer or overlying remaining diffusion layer such tat the metal ions within the resistance variable material are at about the same level as before forming the second electrode.

17. The method of claim 16, wherein forming the second electrode comprises electroplating the second metal.

18. The method of claim 16, wherein forming the second electrode comprises electroless plating the second metal.

19. A method of forming a programmable memory device, comprising
forming a diffusion layer by physical vapor depositing a first metal onto a chalcogenide material overlying and in electrical contact with a first electrode;
forming the chaleogenide material into a resistance variable material by diffusing metal ions from the diffusion layer into the chalcogenide material; and
forming a second electrode by plating a second metal onto the resistance variable material layer or overlying remaining diffusion layer such that the metal ions within the resistance variable material are at about the same level as before forming the second electrode.

20. The method of claim 19, wherein forming the second electrode comprises electroplating the second metal.

21. The method of claim 19, wherein forming the second electrode comprises electroless plating the second metal.

22. A method of forming a non-volatile resistance variable device, comprising:
forming a first electrode on a substrate;
forming a dielectric layer over the first electrode;
forming an opening through the dielectric layer to the first electrode;
depositing a layer of a chalcogenide material into the opening in contact with the first electrode;
chemical vapor depositing a metal onto the chalcogenide material layer to form a diffusion layer;
diffusing metal ions from the diffusion layer into the chalcogenide material layer to form a resistance variable material layer; and
plating a layer of a metal onto the resistance variable material layer or overlying remaining diffusion layer to form a second electrode such that the metal ions within the resistance variable material layer are at about the same level as before the plating step.

23. The method of claim 22, comprising forming the non-volatile resistance variable device into a programmable memory cell of a memory circuitry.

24. A method of forming a non-volatile resistance variable device, comprising:
forming a first electrode on a substrate;
forming a dielectric layer over the first electrode;
forming an opening through the dielectric layer to the first electrode;
depositing a layer of a chalcogenide material into the opening in contact with the first electrode;
physical vapor depositing a metal onto the chalcogenide material layer to form a diffusion layer;
diffusing metal ions from the diffusion layer into the chalcogenide material layer to form a resistance variable material layer; and
plating a layer of a metal onto the resistance variable material layer or overlying remaining diffusion layer to form a second electrode such that the metal ions within the resistance variable material layer are at about the same level as before the plating step.

25. A method of controlling diffusion of metal into a chalcogenide material to form a resistance variable material, comprising:
chemical vapor depositing a diffusion layer comprising a metal onto a chalcogenide material to a thickness of about 100-300 angstroms;
diffusing metal ions into the chalcogenide material to form the resistance variable material; and
plating a layer of a metal over the resistance variable material layer or overlying remaining diffusion layer to a desired thickness such that the metal ions within the resistance variable material are at about the same level as before the plating step.

26. A method of controlling diffusion of metal into a chalcogenide material to form a resistance variable material, comprising:
physical vapor depositing a diffusion layer comprising a metal onto a chalcogenide material to a thickness of about 100-300 angstroms;
diffusing metal ions into the chalcogenide material to form the resistance variable material; and
plating a layer of a metal over the resistance variable material layer or overlying remaining diffusion layer to a desired thickness such that the metal ions within the resistance variable material are at about the same level as before the plating step.

27. A memory device, prepared by the process of:
forming a first electrode on a substrate;
depositing a layer of a chalcogenide material over the first electrode;
chemical vapor depositing a metal onto the chalcogenide material layer to form a diffusion layer;
diffusing metal into the chalcogenide material layer to form a resistance variable material layer; and
plating a metal over the resistance variable material layer or overlying remaining diffusion layer to form a second electrode such that the metal ions within the resistance variable material layer are at about the same level as before the plating step.

28. A memory device, prepared by the process of:

forming a first electrode on a substrate;

depositing a layer of a chalcogenide material over the first electrode;

physical vapor depositing a metal onto the chalcogenide material layer to form a diffusion layer;

diffusing metal into the chalcogenide material layer to form a resistance variable material layer; and plating a metal over the resistance variable material layer or overlying remaining diffusion layer to form a second electrode such that the metal ions within the resistance variable material layer are at about the same level as before the plating step.

* * * * *

UNITED STATES PATENT AND TRADEMARK OFFICE
CERTIFICATE OF CORRECTION

PATENT NO. : 7,264,988 B2  Page 1 of 1
APPLICATION NO. : 11/265750
DATED : September 4, 2007
INVENTOR(S) : Klein It is certified that error appears in the above-identified patent and that said Letters Patent is hereby corrected as shown below:

On the Title page, in field (57), under "Abstract" column 2, line 16, delete "chalogenide" and insert -- chalcogenide --, therefor.

In column 12, line 54, in Claim 6, after "plating" insert -- , --.

In column 13, line 23 (Approx.), in Claim 16, after "comprising" insert -- : --.

In column 13, line 32 (Approx.), in Claim 16, delete "tat" and insert -- that --, therefor.

In column 13, line 41, in Claim 19, after "comprising" insert -- : --.

In column 13, line 45, in Claim 19, delete "chaleogenide" and insert -- chalcogenide --, therefor.

Signed and Sealed this

Twentieth Day of November, 2007

JON W. DUDAS
*Director of the United States Patent and Trademark Office*